(12) United States Patent
Yoshidome et al.

(10) Patent No.: US 10,697,057 B2
(45) Date of Patent: Jun. 30, 2020

(54) COLLIMATOR FOR USE IN A PHYSICAL VAPOR DEPOSITION CHAMBER

(71) Applicant: APPLIED MATERIALS, INC., Santa Clara, CA (US)

(72) Inventors: Goichi Yoshidome, Albany, CA (US); Keith A. Miller, Mountain View, CA (US); Hamid Tavassoli, Cupertino, CA (US); Andrew Tomko, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 130 days.

(21) Appl. No.: 15/814,684

(22) Filed: Nov. 16, 2017

(65) Prior Publication Data

US 2018/0142342 A1    May 24, 2018

Related U.S. Application Data

(60) Provisional application No. 62/424,347, filed on Nov. 18, 2016.

(51) Int. Cl.
| | | |
|---|---|---|
| H01J 37/34 | (2006.01) | |
| C23C 14/34 | (2006.01) | |
| H01J 37/32 | (2006.01) | |
| C23C 14/35 | (2006.01) | |
| C23C 14/56 | (2006.01) | |
| C23C 14/04 | (2006.01) | |

(52) U.S. Cl.
CPC .......... *C23C 14/3414* (2013.01); *C23C 14/35* (2013.01); *C23C 14/564* (2013.01); *C23C 14/568* (2013.01); *H01J 37/32623* (2013.01); *H01J 37/3447* (2013.01); *C23C 14/046* (2013.01)

(58) Field of Classification Search
CPC .. C23C 14/04; H01J 37/32623; H01J 37/3447
USPC ................................... 204/298.11
See application file for complete search history.

(56) References Cited

U.S. PATENT DOCUMENTS

| | | | | |
|---|---|---|---|---|
| 6,036,821 | A * | 3/2000 | Warren | ............... C23C 14/34 204/192.12 |
| 6,080,284 | A * | 6/2000 | Miyaura | ............ C23C 14/0068 204/192.12 |
| 6,692,617 | B1 * | 2/2004 | Fu | .................... C23C 14/3457 204/192.12 |
| 2003/0029715 | A1 | 2/2003 | Yu et al. | |

(Continued)

FOREIGN PATENT DOCUMENTS

JP          10-176267          *   6/1998

OTHER PUBLICATIONS

Machine Translation JP 10-176267 (Year: 1998).*
International Search Report and Written Opinion dated Mar. 21, 2018 for PCT Application No. PCT/US 2017/061975.

*Primary Examiner* — Rodney G McDonald
(74) *Attorney, Agent, or Firm* — Moser Taboada; Alan Taboada

(57) ABSTRACT

Embodiments of collimators and process chambers incorporating same are provided herein. In some embodiments, a collimator for use in a substrate processing chamber includes a ring; an adapter surrounding the ring and having an inner annular wall; and a plurality of spokes extending from the inner annular wall and intersecting at a central axis of the collimator.

20 Claims, 3 Drawing Sheets

(56) References Cited

U.S. PATENT DOCUMENTS

| | | | |
|---|---|---|---|
| 2007/0228302 A1 | 10/2007 | Norman, Jr. | |
| 2009/0308739 A1* | 12/2009 | Riker | H01J 37/34 204/298.11 |
| 2015/0206724 A1 | 7/2015 | Pan et al. | |
| 2016/0145735 A1 | 5/2016 | Riker | |

* cited by examiner

COLLIMATOR FOR USE IN A PHYSICAL VAPOR DEPOSITION CHAMBER

CROSS-REFERENCE TO RELATED APPLICATIONS

This application claims the benefit of U.S. Provisional Patent Application No. 62/424,347, filed with the United States Patent Office on Nov. 18, 2016, which is herein incorporated by reference in its entirety.

FIELD

Embodiments of the present disclosure generally relate to substrate processing equipment.

BACKGROUND

Deposition of films in a process chamber such as, for example, a physical vapor deposition (PVD) chamber has become increasingly different as the size of features in a substrate continues to shrink. In such cases, metallic materials such as, for example, tantalum (Ta) and tantalum nitride (TaN) are frequently chosen as materials to deposit on a substrate to create a barrier film. However, because TaN is a nitride film, TaN has lower cohesion and is more brittle than a metallic film material. As such, during deposition of such materials, the thickness of a film deposited on an upper portion of a process shield of a conventional process kit is greatest, resulting in the flaking off or detachment of the material due to brittleness and poor adhesion/cohesion to the process kit. The flaking is further exacerbated by the thermal expansion and contraction of the process shield caused by bombardment of neutral or ionized material during process step and return to room temperature during an idle state.

Accordingly, the inventors have provided embodiments of an improved collimator.

SUMMARY

Embodiments of collimators and process chambers incorporating same are provided herein. In some embodiments, a collimator for use in a substrate processing chamber includes a ring; an adapter surrounding the ring and having an inner annular wall; and a plurality of spokes extending from the inner annular wall and intersecting at a central axis of the collimator.

In some embodiments, a process chamber, comprises: a chamber body defining an interior volume; a sputtering target disposed in an upper portion of the interior volume; a substrate support disposed in a lower portion of the interior volume opposite the sputtering target; a collimator disposed between the sputtering target and the substrate support, wherein the collimator comprises: a ring; an adapter surrounding the ring and having an inner annular wall, wherein the adapter is coupled to the chamber body; and a plurality of spokes extending from the inner annular wall and intersecting at a central axis of the collimator.

In some embodiments, a monolithic collimator for use in a substrate processing chamber, comprising: a singular ring having an inner diameter of about 285 mm, a height of about 50 mm, and a thickness of about 0.5 inches; an adapter surrounding the singular ring and having an inner annular wall; a plurality of spokes extending from the inner annular wall and intersecting at a central axis of the monolithic collimator, wherein the plurality of spokes are arranged axisymmetrically about a central axis of the monolithic collimator; and a plurality of channels corresponding to and disposed within the plurality of spokes, wherein the plurality of channels extend through the adapter and the singular ring, wherein all surfaces of the collimator within the inner annular wall are texturized.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
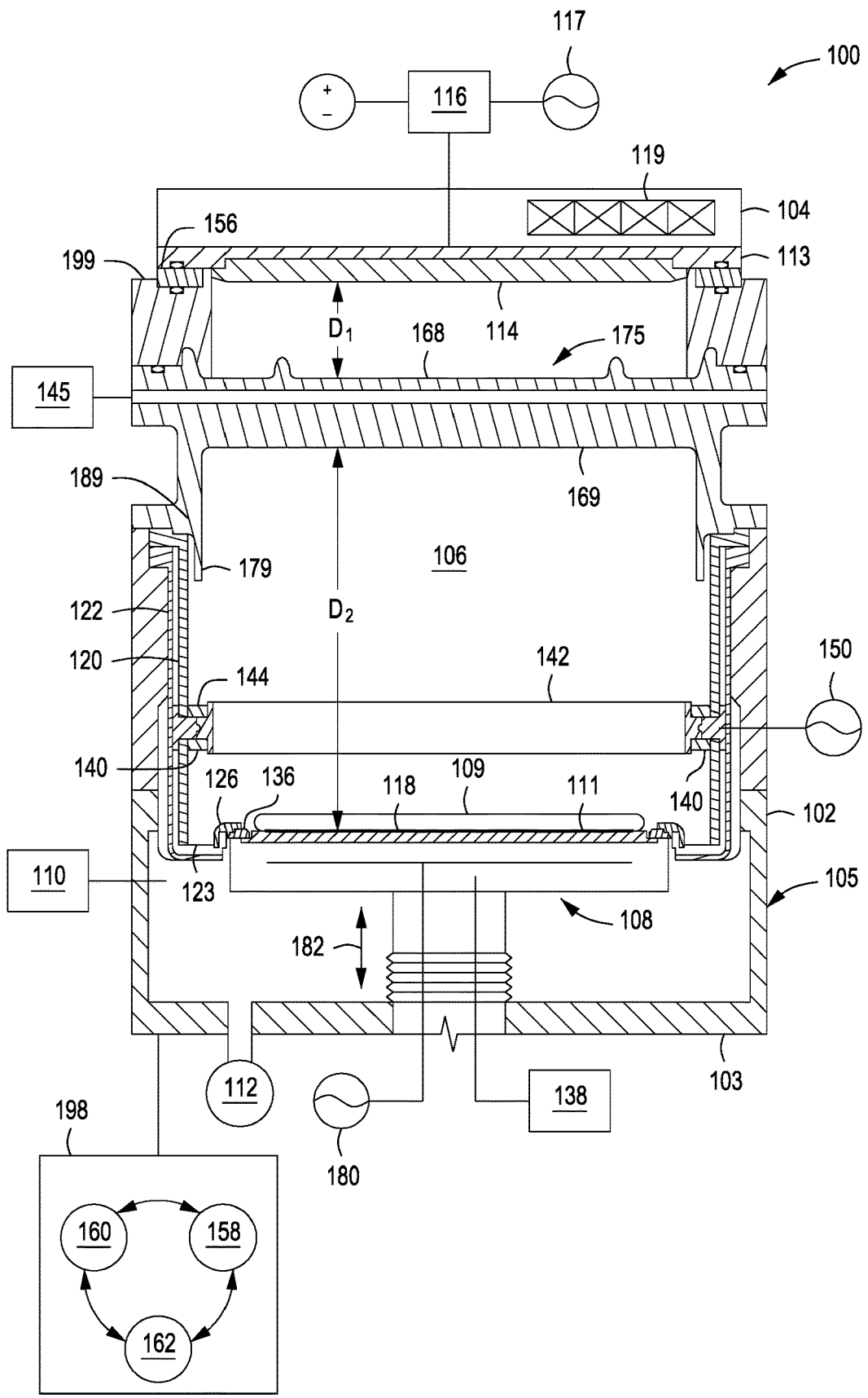
FIG. 1 depicts a cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of collimators and process chambers incorporating such collimators are provided herein. In some embodiments, a collimator having heat transfer channels through which a heat transfer medium flows provided herein. The heat transfer channels advantageously allow for control of the temperature of the collimator. In some embodiments, the heat transfer medium is a coolant, which, when flowed through the collimator, maintains the collimator at a constant temperature, thus advantageously preventing thermal expansion and contraction and preventing flaking off or detachment of sputter material deposited on the collimator. In some embodiments, the collimator may also be texturized to advantageously improve adhesion of sputtered material deposited on the collimator and further alleviate flaking.

FIG. 1 depicts a schematic, cross-sectional view of an illustrative process chamber 100 (e.g., a PVD chamber) having a collimator 175 in accordance with some embodiments of the present disclosure. Examples of suitable PVD chambers include the SIP ENCORE® as well as other PVD processing chambers, commercially available from Applied Materials, Inc., Santa Clara, of Calif. However, the inventive collimator may also be used in processing chambers available from other manufactures. In one embodiment, the process chamber 100 is capable of depositing, for example, tantalum, tantalum nitride, titanium nitride, tungsten, tungsten nitride, and the like, on a substrate 118.

The process chamber 100 has a chamber body 105 that includes sidewalls 102, a bottom 103, and a lid assembly 104 all of which enclose an interior volume 106. A substrate support 108 is disposed in a lower portion of the interior volume 106 of the process chamber 100 opposite the sputtering target 114. A substrate transfer port 109 is formed in the sidewalls 102 for transferring substrates into and out of the interior volume 106.

A gas source 110 is coupled to the process chamber 100 to supply process gases into the interior volume 106. In one embodiment, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and krypton (Kr) among others.

A pump 112 is coupled to the process chamber 100 in communication with the interior volume 106 to control the pressure of the interior volume 106. In one embodiment, the pressure of the process chamber 100 may be maintained at about 1 Torr or less. In another embodiment, the pressure within the process chamber 100 may be maintained at about 500 mTorr or less. In yet another embodiment, the pressure within the process chamber 100 may be maintained at about 1 mTorr and about 300 mTorr.

A backing plate 113 may support a sputtering target 114 in an upper portion of the interior volume 106. The sputtering target 114 generally provides a source of material which will be deposited in the substrate 118. The sputtering target 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like.

The sputtering target 114 may be coupled to a source assembly 116 comprising a power supply 117 for the target. In some embodiments, the power supply 117 may be an RF power supply. In some embodiments, the power supply 117 may alternatively be a DC source power supply. In some embodiments, the power supply 117 may include both DC and RF power sources. A magnetron 119 may be coupled adjacent to the sputtering target 114. Examples of the magnetron 119 assembly include an electromagnetic linear magnetron, a serpentine magnetron, a spiral magnetron, a double-digitated magnetron, a rectangularized spiral magnetron, among others. Magnetrons can be comprised from permanent rare earth magnets. The magnetron 119 may confine the plasma as well as distribute the concentration of plasma along the sputtering target 114.

An additional RF power source 180 may also be coupled to the process chamber 100 through the substrate support 108 to provide a bias power to the substrate support 108, as needed. In one embodiment, the RF power source 180 may provide power to the substrate support 108 to bias the substrate 118 at a frequency between about 1 MHz and about 100 MHz, such as about 13.56 MHz.

The substrate support 108 may be moveable between a raised position and a lowered position, as shown by arrow 182. In the lowered position, a support surface 111 of the substrate support 108 may be aligned with or just below the substrate transport port 109 to facilitate entry and removal of the substrate 118 from the process chamber 100. The support surface 111 may have an edge deposition ring 136 sized to receive the substrate 118 thereon while protecting the substrate support 108 from plasma and deposited material. The substrate support 108 may be moved to the raised position closer to the sputtering target 114 for processing the substrate 118 in the process chamber 100. A cover ring 126 may engage the edge deposition ring 136 when the substrate support 108 is in the raised position. The cover ring 126 may prevent deposition material from bridging between the substrate 118 and the substrate support 108. When the substrate support 108 is in the lowered position, the cover ring 126 is suspended above the substrate support 108 and substrate 118 positioned thereon to allow for substrate transfer.

During substrate transfer, a robot blade (not shown) having the substrate 118 thereon is extended through the substrate transfer port 109. Lift pins (not shown) extend through the support surface 111 of the substrate support 108 to lift the substrate 118 from the support surface 111 of the substrate support 108, thus allowing space for the robot blade to pass between the substrate 118 and substrate support 108. The robot may then carry the substrate 118 out of the process chamber 100 through the substrate transfer port 109. Raising and lowering of the substrate support 108 and/or the lift pins may be controlled by the controller 198.

During sputter deposition, the temperature of the substrate 118 may be controlled by utilizing a thermal controller 138 disposed in the substrate support 108. The substrate 118 may be heated or cooled to a desired temperature for processing. The thermal controller 138 controls the temperature of the substrate 118, and may be utilized to change the temperature of the substrate 118 from a first temperature to a second temperature in a matter of seconds to about a minute if the incoming substrate temperature is different from the temperature of the substrate support.

An inner shield 120 may be positioned in the interior volume 106 between the sputtering target 114 and the substrate support 108. The inner shield 120 may be formed of aluminum or stainless steel among other materials. In one embodiment, the inner shield 120 is formed from aluminum. An outer shield 122 may be formed between the inner shield 120 and the sidewall 102. The outer shield 122 may be formed from aluminum or stainless steel among other materials. The outer shield 122 may extend past the inner shield 120 and is configured to support the cover ring 126 when the substrate support 108 is in the lowered position.

In one embodiment, the inner shield 120 includes a radial flange 123 that includes an inner diameter that is greater than an outer diameter of the inner shield 120. The radial flange 123 extends from the inner shield 120 at an angle greater than about ninety degrees (90°) relative to the inside diameter surface of the inner shield 120. The radial flange 123 may be a circular ridge extending from the surface of the inner shield 120 and is generally adapted to mate with a recess formed in the cover ring 126 disposed on the substrate support 108. The recess may be a circular groove formed in the cover ring 126 which centers the cover ring 126 with respect to the longitudinal axis of the substrate support 108.

The process chamber 100 further includes a collimator 175 disposed between the sputtering target 114 and the substrate support 108. In some embodiments, the collimator 175 is monolithic (i.e., a unitary structure) to improve thermal conductivity between the various portions of the collimator. In some embodiments, the collimator 175 may be made with newer manufacturing techniques, such as, for example, additive manufacturing (i.e., 3D printing). The process chamber 100 also includes a heat transfer medium supply 145 fluidly coupled to a plurality of heat transfer channels 220 (described below with respect to FIGS. 2A and 2B) disposed within the collimator 175 to control a temperature of the collimator 175. In some embodiments, the heat transfer medium supply 145 supplies a coolant such as, for example, water to the plurality of heat transfer channels 220 to maintain the collimator 175 at a constant temperature and advantageously avoid thermal expansion and contraction of the collimator 175, thus reducing the flaking off or detachment of sputter deposits from the collimator 175. The collimator 175 interfaces with an adapter 199 to ensure proper coupling of the lid assembly 104 with the rest of the chamber when the lid assembly 104 is closed (as shown in FIG. 1). An insulator 156 may be disposed between the lid assembly 104 and the adapter 199 to electrically isolate the adapter (and, thus, the collimator 175) from the lid assembly 104. The collimator 175 includes a flange portion 189, which can rest on the sidewalls 102 of the process chamber 100 when the collimator 175 is installed in the chamber. In some embodiments, the collimator 175 may include a downwardly projecting lip 179 that overlaps with the inner shield 120 to prevent sputtered material from being deposited on the top surface of the inner shield 120.

In some embodiments, an upper surface 168 of the collimator 175 is spaced apart from a bottom surface of the sputtering target 114 by a first distance $D_1$ between about 25 mm and about 75 mm. In some embodiments, the first distance $D_1$ is about 50 mm. In some embodiments, a lower surface 169 of the collimator 175 is spaced apart from the support surface 111 of the substrate support 108 by a second distance D2 between about 255 mm and about 335 mm. In some embodiments, the upper and lower surfaces 168, 169 are the upper and lower surfaces of spokes of the collimator 175 (discussed below).

Figure 2:
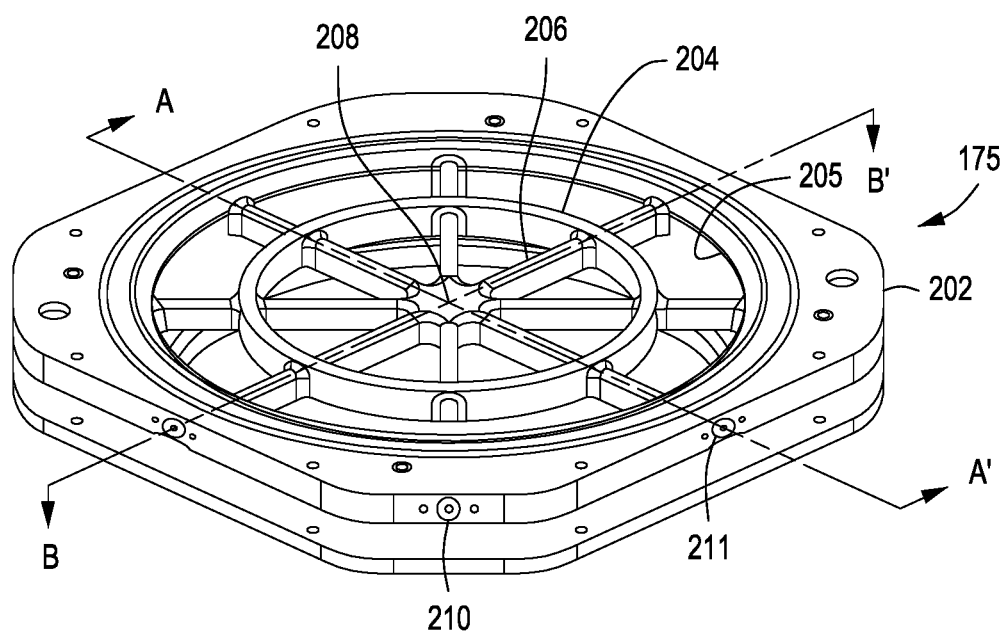
FIG. 2 depicts a isometric view of a collimator in accordance with some embodiments of the present disclosure.
Figure 2A:
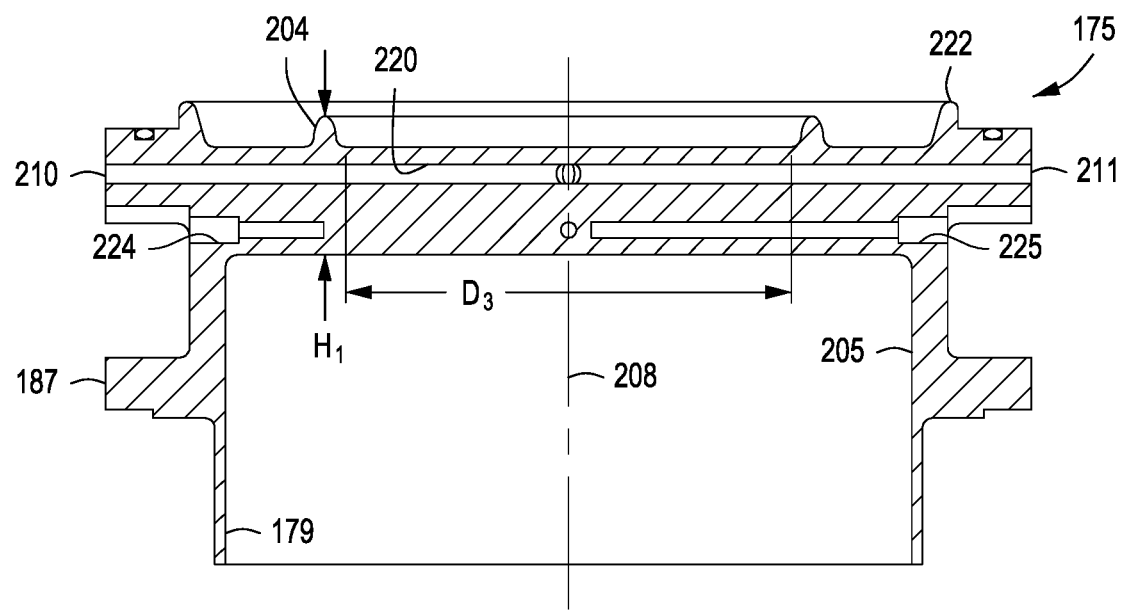
FIG. 2A depicts a side cross-sectional view of the collimator of FIG. 2 taken along line A-A'.
Figure 2B:
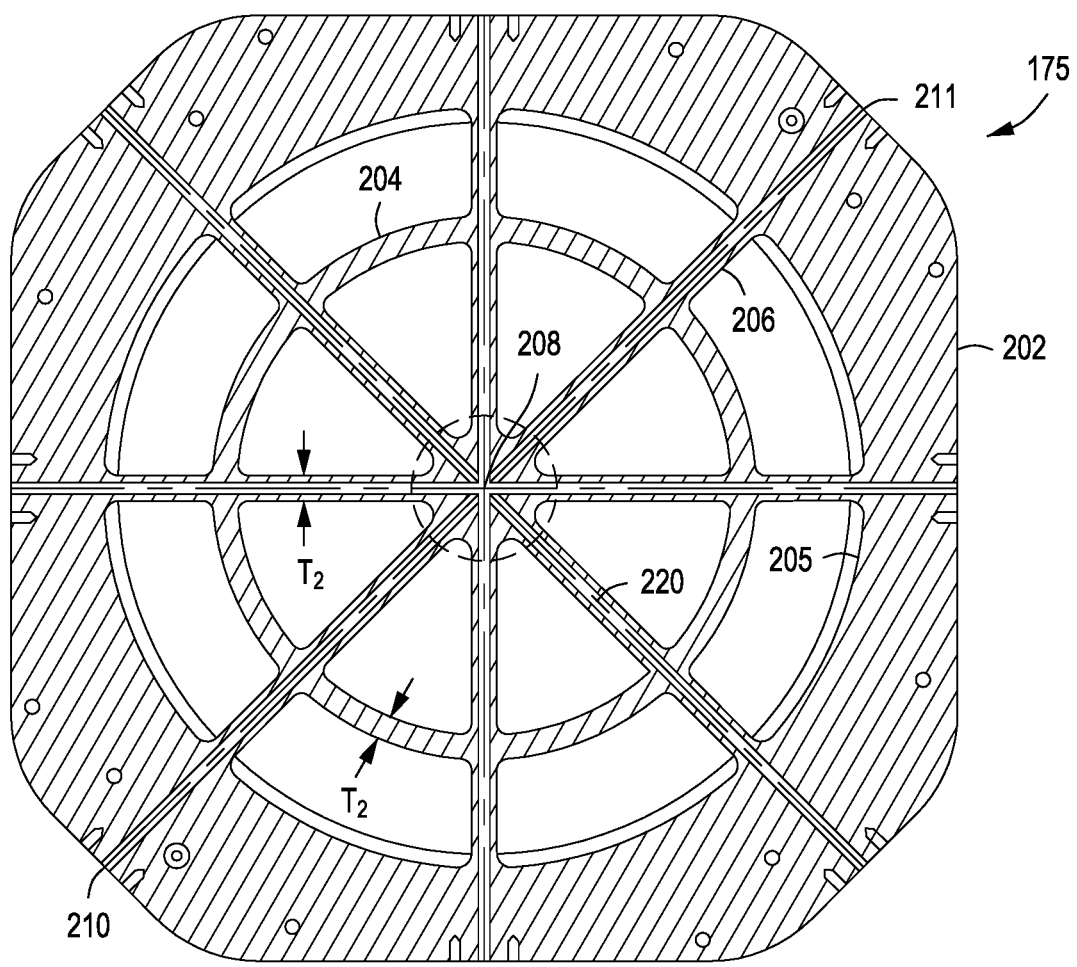
FIG. 2B depicts a top cross-sectional view of the collimator of FIG. 2 taken along line B-B'.

FIGS. 2-2B depict isometric and cross-sectional views of the collimator 175 in accordance with some embodiments of the present disclosure. In some embodiments, the collimator includes a body 202, a ring 204 disposed within and concentric with the body 202, and a plurality of spokes 206 extending radially inward from an inner annular wall 205 and intersecting at a central axis 208 of the collimator 175 axissymmetrically to the central axis 208. In some embodiments, and as illustrated in FIGS. 2 and 2B, the plurality of spokes 206 are eight spokes. In some embodiments, the collimator 175 may have fewer or more spokes. More spokes would cause increased deposition blockage and, thus, reduce the deposition rate, which in some circumstances is desirable (e.g., small features require lower deposition rate). Fewer spokes results in less cooling of the collimator 175.

The inventors have observed that a collimator having a single ring 204 advantageously improves deposition uniformity on a substrate being processed. In some embodiments, the collimator 175 may alternatively have more than one ring 204. As explained above, deposition of some materials, such as, for example, a Ta/TaN stack tend to flake off of the collimator, thus contaminating the substrate and/or the substrate support. As such, the spokes 206 include heat transfer channels 220 disposed inside of the spokes 206 to facilitate control of the temperature of the collimator 175.

The heat transfer medium supply 145 supplies a heat transfer medium to each heat transfer channel 220 via a corresponding inlet 210. After the heat transfer medium flows through a given spoke 206 and, subsequently, the spoke on the opposite side of the central axis 208, the heat transfer medium flows out of a corresponding outlet 211 oppositely disposed to the inlet 210. In the embodiment in which the collimator 175 includes eight spokes 206, the collimator 175 includes four inlets 210 and four outlets 211 oppositely disposed to the inlets 210. In some embodiments, all of the inlets 210 may be adjacent and, thus, the outlets as well. In some embodiments, the inlets 210 and the outlets 211 may alternate so that one spoke receiving heat transfer medium supplied to the collimator 175 is adjacent a spoke that is returning heat transfer medium from the collimator 175, thus resulting in counterflow and improved thermal control of the collimator 175. The size (diameter) and conductance of the heat transfer channels 220 are configured so that when the heat transfer medium flows through the channels, the temperature of the collimator 175 is maintained at a temperature between about 15° C. and about 30° C. To avoid any potential leakage of the heat transfer medium inside of the process chamber 100, the inlets and outlets 210, 211 are disposed externally to the interior volume 106, as shown in FIG. 1.

Referring to FIG. 2A, the ring 204 has an inner diameter $D_3$ between about 210 mm and about 325 mm. In some embodiments, the diameter $D_3$ is between about 250 mm and about 310 mm. In some embodiments, the diameter $D_3$ is about 285 mm. The size of the diameter $D_3$ is dependent on the type of magnetron 119 used, the distance between the sputtering target 114 and the collimator 175, and a vertical thickness $h_1$ of the ring 204. In some embodiments, the vertical thickness $h_1$ may be between about 40 mm to about 70 mm. In some embodiments, the vertical thickness $h_1$ may be about 45 mm. In some embodiments, the collimator 175 may optionally have a first blind hole 224, through which thermocouple (not shown) may be inserted to measure a temperature of the ring 204, and a second blind hole 225, through which another thermocouple (not shown) may be inserted to measure a temperature of the intersection of the heat transfer channels 220.

Referring to FIG. 2B, in some embodiments, a thickness $T_2$ of the ring 204 and each spoke 206 may be between about 0.25 inches and 1.5 inches. In some embodiments, the thickness $T_2$ may be about 0.5 inches. The thicknesses of the ring 204 and each spoke 206 may be the same or different.

In some embodiments, all surfaces of the collimator 175 disposed radially inward of the inner annular wall 205 (including the annular wall 205) are texturized to improve adhesion of the sputtered material to the collimator 175. For example, the texturized surfaces may have a surface roughness between about 1,150 micro-inches and about 1,500 micro-inches. The texturized surfaces may be texturized using any texturizing method such as, for example, LAVA-COAT™, bead blasting, or the like. In some embodiments, the texturized surfaces are texturized using an aluminum arc spray that uniformly coats all of the texturized surfaces.

Returning to FIG. 1, a controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100 and controlling ion bombardment of the sputtering target 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a specific purpose computer (controller) 198 that controls the process chamber 100 such that processes are performed in accordance with the present disclosure. The software routines may also be stored and/or executed by a second controller (not shown) that is located remotely from the process chamber 100.

In some embodiments, the process chamber 100 may include an inductive coil 142, according to one embodiment. The inductive coil 142 of the process chamber 100 may have one turn. The inductive coil 142 may be just inside the inner shield 120 and positioned above the substrate support 108. The inductive coil 142 may be positioned nearer to the substrate support 108 than the sputtering target 114. The inductive coil 142 may be formed from a material similar in composition to the sputtering target 114, such as, for example, tantalum, to act as a secondary sputtering target. The inductive coil 142 is supported from the inner shield 120 by a plurality of coil spacers 140. The coil spacers 140 may electrically isolate the inductive coil 142 from the inner shield 120 and other chamber components.

The inductive coil 142 may be coupled to a power source 150. The power source 150 may have electrical leads which penetrate the sidewall 102 of the process chamber 100, the outer shield 122, the inner shield 120 and the coil spacers 140. The electrical leads connect to a tab 144 on the inductive coil 142 for providing power to the inductive coil 142. The tab 144 may have a plurality of insulated electrical connections for providing power to the inductive coil 142. Additionally, the tabs 144 may be configured to interface with the coil spacers 140 and support the inductive coil 142. The power source 150 applies current to the inductive coil 142 to induce an RF field within the process chamber 100 and couple power to the plasma for increasing the plasma density, i.e., concentration of reactive ions.

While the foregoing is directed to embodiments of the present disclosure, other and further embodiments of the disclosure may be devised without departing from the basic scope thereof.

The invention claimed is:

1. A collimator for use in a substrate processing chamber, comprising:
   a ring;
   a body surrounding the ring and having an inner annular wall;
   a plurality of spokes extending from the inner annular wall and intersecting at a central axis of the collimator; and
   a plurality of channels corresponding to and disposed within the plurality of spokes, wherein each channel of the plurality of channels extends from a corresponding inlet disposed on an outer sidewall of the body to a corresponding outlet disposed on an opposite side of the body.

2. The collimator of claim 1, wherein the plurality of channels have a substantially uniform cross-sectional area from the inlet to the outlet.

3. The collimator of claim 1, wherein the collimator is a unitary structure.

4. The collimator of claim 1, wherein the ring has an inner diameter between about 210 mm and about 325 mm.

5. The collimator of claim 1, wherein the ring has a height between about 40 mm and about 70 mm.

6. The collimator of claim 1, wherein the ring and the plurality of spokes have a thickness between about 0.25 inches to about 1.5 inches.

7. The collimator of claim 1, wherein the ring is a single ring.

8. The collimator of claim 1, wherein all surfaces of the collimator disposed radially inward of the inner annular wall are texturized.

9. The collimator of claim 8, wherein the texturized surfaces have a surface roughness between about 1,150 micro-inches to about 1,500 micro-inches.

10. The collimator of claim 9, wherein the texturized surfaces are formed of an aluminum arc spray coating.

11. The collimator of claim 1, wherein the plurality of spokes are eight spokes arranged axisymmetrically about a central axis of the collimator.

12. A process chamber, comprising:
   a chamber body defining an interior volume;
   a sputtering target disposed in an upper portion of the interior volume;
   a substrate support disposed in a lower portion of the interior volume opposite the sputtering target; and
   a collimator disposed between the sputtering target and the substrate support, wherein the collimator comprises the collimator of claim 1.

13. The process chamber of claim 12, wherein an upper surface of the collimator is spaced apart from a bottom surface of the sputtering target by a first distance between about 25 mm to about 75 mm.

14. The process chamber of claim 13, wherein a lower surface of the collimator is spaced apart from a support surface of the substrate support by a second distance between about 255 mm to about 335 mm.

15. The process chamber of claim 12, further comprising:
   a magnetron disposed above the sputtering target to assist with sputtering of the sputtering target.

16. The process chamber of claim 12,
   wherein the plurality of channels have a substantially uniform cross-sectional area.

17. The process chamber of claim 16, further comprising:
   a heat transfer medium supply fluidly coupled to the plurality of channels to flow a heat transfer medium through the plurality of channels.

18. The process chamber of claim 12, wherein the ring has at least one of:
   an inner diameter between about 210 mm and about 325 mm; or
   a height between about 40 mm and about 70 mm.

19. A monolithic collimator for use in a substrate processing chamber, comprising:
   a singular ring having an inner diameter of about 285 mm, a height of about 50 mm, and a thickness of about 0.5 inches;
   a body surrounding the singular ring and having an inner annular wall;
   a plurality of spokes extending from the inner annular wall and intersecting at a central axis of the monolithic collimator, wherein the plurality of spokes are arranged axisymmetrically about a central axis of the monolithic collimator; and
   a plurality of channels corresponding to and disposed within the plurality of spokes, wherein the plurality of channels extend through the body and the singular ring, wherein all surfaces of the monolithic collimator within the inner annular wall are texturized.

20. A collimator for use in a substrate processing chamber, comprising:
   a single ring;
   a body surrounding the single ring and having an inner annular wall; and
   a plurality of spokes extending from the inner annular wall and intersecting at a central axis of the collimator.

* * * * *